(12) United States Patent
Scholz et al.

(10) Patent No.: US 10,134,960 B2
(45) Date of Patent: Nov. 20, 2018

(54) SEMICONDUCTOR LAYERING SEQUENCE FOR GENERATING VISIBLE LIGHT AND LIGHT EMITTING DIODE

(71) Applicant: OSRAM Opto Semiconductors GmbH, Regensburg (DE)

(72) Inventors: Dominik Scholz, Regensburg (DE); Martin Mandl, Lappersdorf (DE); Ion Stoll, Tegernheim (DE); Martin Strassburg, Donaustauf (DE); Barbara Huckenbeck, Augsburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/533,006

(22) PCT Filed: Dec. 3, 2015

(86) PCT No.: PCT/EP2015/078569
§ 371 (c)(1),
(2) Date: Jun. 2, 2017

(87) PCT Pub. No.: WO2016/087605
PCT Pub. Date: Jun. 9, 2016

(65) Prior Publication Data
US 2017/0358719 A1 Dec. 14, 2017

(30) Foreign Application Priority Data
Dec. 5, 2014 (DE) .................. 10 2014 117 995

(51) Int. Cl.
*H01L 33/08* (2010.01)
*H01L 33/50* (2010.01)
(Continued)

(52) U.S. Cl.
CPC ............ *H01L 33/505* (2013.01); *H01L 33/16* (2013.01); *H01L 33/508* (2013.01); *H01L 33/08* (2013.01);
(Continued)

(58) Field of Classification Search
CPC ..... H01L 33/505; H01L 33/508; H01L 33/16; H01L 33/24; H01L 33/08
See application file for complete search history.

(56) References Cited

U.S. PATENT DOCUMENTS 7,521,274 B2 * 4/2009 Hersee .................. B82Y 20/00
438/41
8,519,379 B2 * 8/2013 Yu ..................... H01L 27/14607
257/14
(Continued)

FOREIGN PATENT DOCUMENTS

DE 102012101718 A1 9/2013
DE 102103100291 A1 7/2014
(Continued)

OTHER PUBLICATIONS

Kim, T.: "A nanopyramid structure for monolithic white-light LEDs," SPIE Newsroom, Jan. 2013, 3 pages.
(Continued)

*Primary Examiner* — Kyoung Lee
*Assistant Examiner* — Christina Sylvia
(74) *Attorney, Agent, or Firm* — McDermott Will & Emery LLP

(57) ABSTRACT

In at least one embodiment, the semiconductor layering sequence (1) is designed for generating light and comprises semiconductor columns (2). The semiconductor columns (2) have a respective core (21) made of a semiconductor material of a first conductivity type, and a core shell (23) surrounding the core (21) made of a semiconductor material
(Continued)

Figure 1:
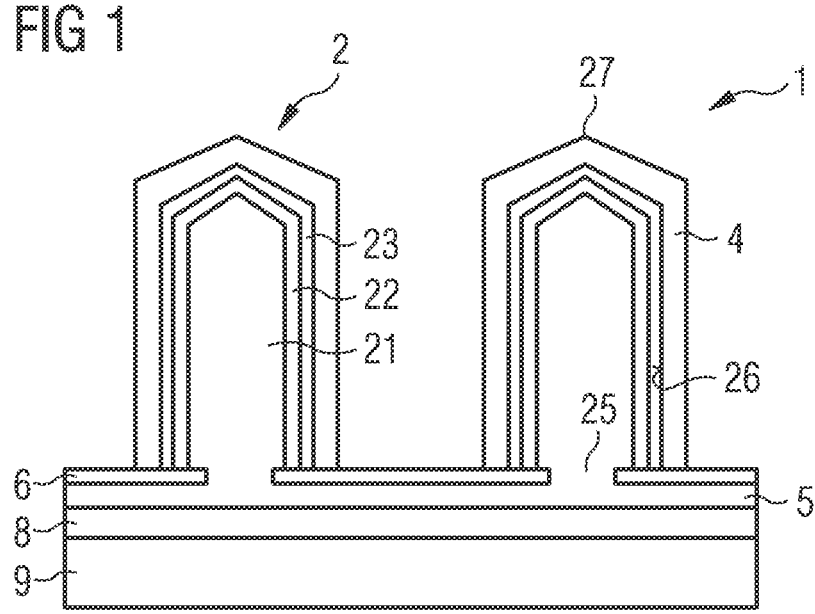

of a second conductivity type. There is an active zone (22) between the core (21) and the core shell (23) for generating a primary radiation by means of electroluminescence. A respective conversion shell (4) is placed onto the semiconductor columns (2), which conversion shell at least partially interlockingly surrounds the corresponding core shell (23), and which at least partially absorbs the primary radiation and converts same into a secondary radiation of a longer wavelength by means of photoluminescence. The conversion shells (4) which are applied to adjacent semiconductor columns (2), only incompletely fill an intermediate space between the semiconductor columns (2).

15 Claims, 4 Drawing Sheets

(51) Int. Cl.
*H01L 33/16* (2010.01)
*H01L 33/24* (2010.01)
(52) U.S. Cl.
CPC ...... *H01L 33/24* (2013.01); *H01L 2933/0041* (2013.01)

(56) References Cited

U.S. PATENT DOCUMENTS

| | | | |
|---|---|---|---|
| 8,669,125 B2 * | 3/2014 | Lowgren | B82Y 20/00 438/22 |
| 2008/0012030 A1 * | 1/2008 | Yoon | H01L 33/24 257/88 |
| 2010/0259184 A1 | 10/2010 | Kato et al. | |
| 2011/0254043 A1 * | 10/2011 | Negishi | H01L 33/20 257/99 |
| 2012/0032768 A1 | 2/2012 | Fox et al. | |
| 2012/0243092 A1 * | 9/2012 | Muller | H01L 31/0392 359/507 |
| 2013/0026524 A1 | 1/2013 | Chiang et al. | |
| 2013/0200334 A1 | 8/2013 | Zhang et al. | |
| 2014/0138620 A1 * | 5/2014 | Svensson | H01L 33/007 257/13 |
| 2014/0239327 A1 | 8/2014 | Konsek et al. | |
| 2015/0021636 A1 * | 1/2015 | Mandl | H01L 33/08 257/88 |

FOREIGN PATENT DOCUMENTS

| | | |
|---|---|---|
| DE | 102013114466 A1 | 6/2015 |
| EP | 2549330 A1 | 1/2013 |
| JP | 2005-191306 A | 7/2005 |

OTHER PUBLICATIONS

Koelper, C. et al.: "Core-shell InGaN nanorod light emitting diodes: Electronic and optical device properties," Phys. Status Solidi A 209, No. 11, pp. 2304-2312 (2012).

Koelper, C. et al.: "Optical Properties of Individual GaN Nanorods for Light Emitting Diodes: Influence of Geometry, Materials and Facets," Proc. of SPIE vol. 7933, 793314-9, 2011.

Mandl, M. et al.: "Group III nitride core-shell nano- and microrods for optoelectronic applications," Phys. Status Solidi RRL, 1-15, (2013).

* cited by examiner

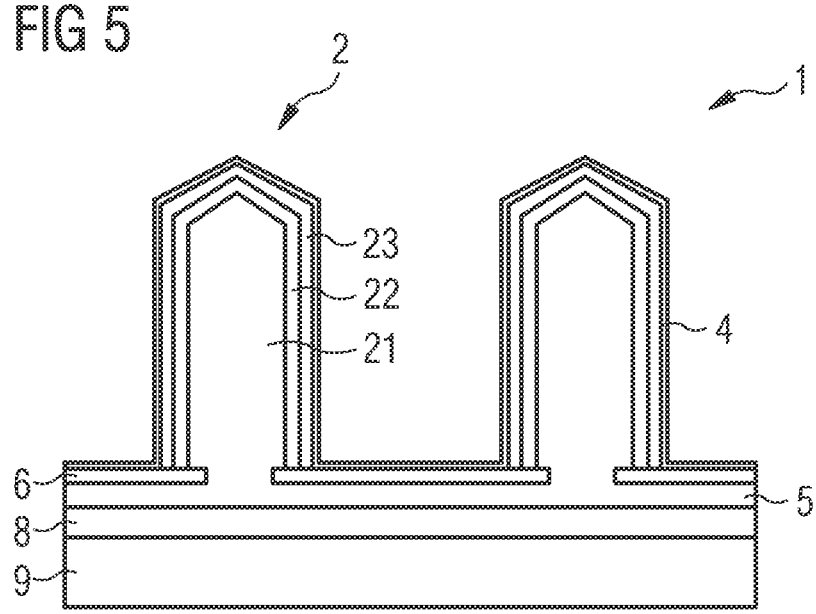
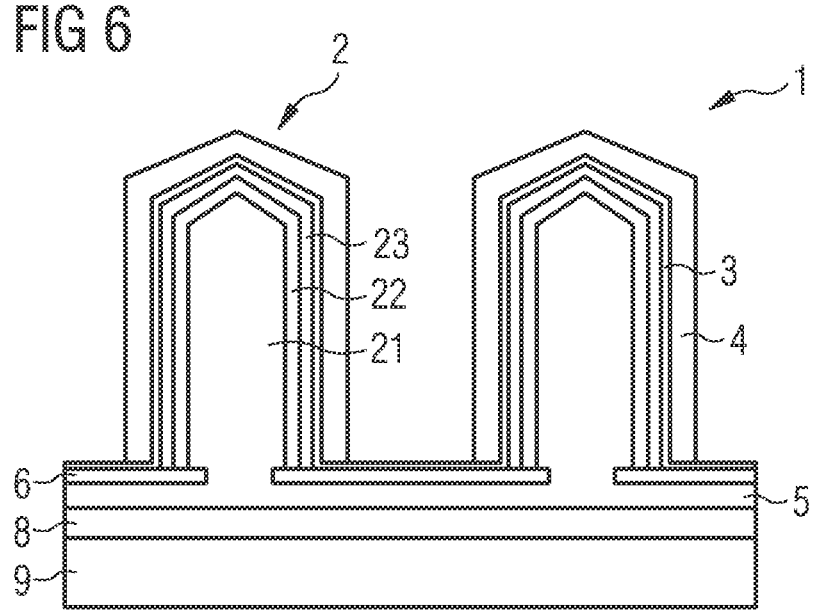

SEMICONDUCTOR LAYERING SEQUENCE FOR GENERATING VISIBLE LIGHT AND LIGHT EMITTING DIODE

A semiconductor layer sequence for generating visible light is provided. A light-emitting diode with such a semiconductor layer sequence is also provided.

An object to be achieved is to provide a semiconductor layer sequence in which primary radiation is coupled optically efficiently to a conversion material.

This object is achieved inter alia by a semiconductor layer sequence and by a light-emitting diode having the features of the independent claims. Preferred further developments constitute the subject matter of the dependent claims.

According to at least one embodiment, the semiconductor layer sequence is designed to generate visible light. When in proper use, the semiconductor layer sequence generates colored or white light. The semiconductor layer sequence may optionally additionally generate a fraction of the radiation in the ultraviolet and/or in the near infrared region of the spectrum. The visible region of the spectrum is in the present case considered in particular to be the wavelength range between 400 nm and 720 nm inclusive. The semiconductor layer sequence preferably comprises a light-emitting diode layer sequence.

According to at least one embodiment, the semiconductor layer sequence comprises a multiplicity of semiconductor columns. The term semiconductor column may mean that an average diameter of the semiconductor columns is smaller than an average height of the semiconductor columns. The height of the semiconductor columns is here oriented in particular in parallel to a growth direction or main growth direction. It is possible for the semiconductor columns to have a constant or approximately constant diameter along the main growth direction, for example with a tolerance of at most 30% of an average diameter. In a tip region, the semiconductor columns for example have a pyramidal or conical structure and/or end with a flat plateau. In this case, the tip region is preferably not used to determine the average diameter.

According to at least one embodiment, the semiconductor columns each comprise a core of a semiconductor material of a first conductivity type. The core is for example n-doped.

According to at least one embodiment, the semiconductor columns each comprise a core shell, which is grown and shaped around the core. The core shell is formed of a semiconductor material of a second conductivity type, wherein the second conductivity type differs from the first conductivity type. In particular, the core shell is p-doped.

According to at least one embodiment, an active zone of the semiconductor columns is located between the core of the semiconductor columns and the core shell. The active zone preferably likewise envelops the core. The active zone is designed to generate primary radiation. The primary radiation is generated by means of electroluminescence, i.e. by charge carrier recombination. The active zone may directly adjoin the core and the core shell. In other words, the core and the core shell are then connected together via the active zone. The core, the active zone and the core shell are preferably based on the same semiconductor material. The active zone may be a single quantum well structure, SQW for short, or a multiple quantum well structure, MQW for short.

The semiconductor material is for example a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $m+n \leq 1$ applies. The semiconductor material may in this case additionally comprise a significant quantity of admixed boron and also dopants. For simplicity's sake, however, only the essential constituents of the crystal lattice of the semiconductor material are indicated, i.e. B, Al, As, Ga, In, N and/or P, even if these may in part be replaced and/or supplemented by small quantities of further substances.

According to at least one embodiment, a conversion shell is applied to each of the semiconductor columns. The conversion shell partially or completely encloses the associated core shell. In particular, the core shell lies in form-fitting manner over the associated semiconductor column. Form-fitting may mean that the conversion shell copies the shape of the semiconductor columns.

It is thus possible for the conversion shell to represent a good fit with regard to the semiconductor columns, wherein the conversion shell may be formed the same size or indeed larger than the outer shape of the semiconductor columns.

According to at least one embodiment, the conversion shell is formed from one or from a plurality of inorganic materials. Furthermore, the material of the conversion shell is preferably a crystalline, in particular a polycrystalline material.

According to at least one embodiment, the conversion shell is designed to generate secondary radiation, wherein the secondary radiation is of a longer wavelength than the primary radiation. The secondary radiation is generated from the primary radiation by way of photoluminescence, such that the conversion shell partially or completely absorbs the primary radiation and converts it into the secondary radiation. Preferably, no or no significant proportion of radiation is generated in the conversion shell by way of electroluminescence.

According to at least one embodiment, the conversion shell only incompletely fills an interspace between adjacent semiconductor columns to which the conversion shell is applied. In other words, in the region for instance of the semiconductor column tips no continuous, for example rectilinear connection is produced between the semiconductor columns solely by way of the conversion shell. In particular, the conversion shell is U-shaped when viewed in cross-section, wherein the semiconductor columns are rectangular in cross-section. Furthermore, there is preferably a region between adjacent semiconductor columns which is purposefully free of a luminescent material. For instance, between two adjacent semiconductor columns, when viewed in cross-section, there may be precisely three sub-zones in the direction perpendicular to a main extent of the semiconductor columns: two sub-zones with luminescent material, which are preferably located directly at the semiconductor columns, and a third intermediate sub-zone without luminescent material.

In at least one embodiment, the semiconductor layer sequence is designed to generate visible light and comprises a multiplicity of semiconductor columns. The semiconductor columns each comprise a core of a semiconductor material of a first conductivity type and a core shell around the core of a semiconductor material of a second conductivity type. Between the core and the core shell there is located an active zone for generating primary radiation by means of electroluminescence, wherein the active zone is associated with the corresponding semiconductor column. A conversion shell is applied onto each of the semiconductor columns, said conversion shell surrounding the associated core shell at least partially form-fittingly and at least partially absorbing the primary radiation and converting it into secondary radiation of a longer wavelength by way of photoluminescence. The conversion shells, which are applied to adjacent semiconductor columns, only incompletely fill an interspace between the semiconductor columns.

For many applications, for example in general lighting, high-quality white light is required, for instance with a high color rendering index. Such white light is conventionally generated in the case of light-emitting diodes by a mixture of blue and/or cyan-colored light, which is predominantly generated in a semiconductor device by way of electroluminescence, with light of a longer wavelength, which is generated by a conversion material excited by the semiconductor device. Conventional conversion elements are based for example on a matrix material, for instance of a silicone or a ceramic, in which a luminescent material is embedded. Such a conversion material is conventionally applied subsequently after production of the semiconductor layer sequence.

The semiconductor columns described here with typical average diameters of a few 100 nm to several µm in particular offer the advantage of enlarging the surface area relative to the base area of the growth substrate. If the active zone, as described above, is applied as an envelope, this allows enlargement of the active volume, which, with identical current feed and base area, may advantageously allow a gain in efficiency and/or, by reducing the base area per chip, allows an increase in the number of LED chips per growth substrate while simultaneously achieving the luminance required for use.

Such semiconductor columns are also known as core/shell microrods. The semiconductor columns are preferably made from a III-N material and each emit blue, cyan-colored or green light, for instance in the range from 400 nm to 550 nm, depending on indium content and thickness of the active zone. To generate white light with such semiconductor columns, a conversion material may be introduced into a light path. Subsequent introduction of such a conversion material is technically complex owing to the small distance between adjacent semiconductor columns. Likewise, with conventional conversion materials small particle sizes have then to be selected, which leads comparatively major light diffusion in the immediate vicinity of the semiconductor layer sequence, which may be associated with reduced efficiency. With the semiconductor layer sequence described here, the conversion shell is applied directly to the semiconductor layer sequence, wherein this application of the conversion shell may directly follow a production process for the semiconductor layer sequence itself. Efficiency may thus be increased and production is simplified.

According to at least one embodiment, the semiconductor columns are grown on a contiguous base layer. The base layer is preferably based on the same semiconductor material as the semiconductor columns, for example on AlInGaN or GaN. Foot points of the semiconductor columns thus each emerge from the base layer. The foot points are thus regions of the semiconductor columns which have grown directly out of the base layer and are thus in direct contact with the base layer.

According to at least one embodiment, the conversion shell is applied to the semiconductor columns form-fittingly at least on each of the tips, opposite the foot points, and on lateral surfaces of the semiconductor columns. The lateral surfaces here connect the tips to the foot points. The tips are preferably pyramidal or conical in form and/or end with a flat plateau. It is possible for the conversion shell to be in touching contact with the base layer.

According to at least one embodiment, the conversion shell has a constant thickness, with for example a tolerance of at most 50% or 20% or 10% of an average thickness of the conversion shell. In other words, the conversion shell is applied with uniform thickness to the semiconductor columns.

Constant thickness of the conversion shell is however not absolutely necessary. Alternatively, a thicker layer of the conversion shell may be deposited in an upper region on semiconductor column tips remote from the base layer, for instance in order likewise also to convert the light there which would otherwise travel only a short distance in the conversion shell.

According to at least one embodiment, an average thickness of the conversion shell is at least 2 nm or 15 nm or 30 nm. Alternatively or in addition, the average thickness of the conversion shell is at most 500 nm or 150 nm or 50 nm. In other words, the conversion shell is comparatively thin. In particular, the thickness of the conversion shell is at most 50% of a vacuum wavelength of maximum intensity of the primary radiation, divided by the average refractive index of the conversion shell.

According to at least one embodiment, an average column diameter of the semiconductor columns, in particular in the region of the lateral surfaces, is at least 0.1 µm or 0.25 µm or 0.5 µm. Alternatively or in addition, the average column diameter is at most 10 µm or 5 µm or 2 µm or 1 µm.

According to at least one embodiment, an average column height of the semiconductor columns amounts to at least 0.5 µm or 2 µm or 5 µm. Furthermore, the average column height may be at most 100 µm or 50 µm or 20 µm.

According to at least one embodiment, a quotient of the column height and the column diameter is at least 1 or 2.5 or 5 or 10. Alternatively or in addition, this quotient is at most 200 or 100 or 25.

According to at least one embodiment, an average distance between adjacent semiconductor columns amounts to at least 0.5 µm or 1.5 µm or 3 µm. Alternatively or in addition, the average roughness is at most 20 µm or 10 µm or 5 µm.

According to at least one embodiment, the conversion shell for converting the primary radiation is formed of one or more layers of a III-V semiconductor material and/or of a II-VI semiconductor material or the conversion shell comprises one or more of the stated materials. It is possible for the semiconductor material to be doped in places or throughout and/or to be provided with defects. The concentration of the dopant and/or of the defects is preferably at least $1 \times 10^{16}$ 1/cm$^3$ or $1 \times 10^{18}$ 1/cm$^3$ or $1 \times 10^{19}$ 1/cm$^3$. Alternatively or in addition, this concentration is at most $1 \times 10^{23}$ 1/cm$^3$ or $1 \times 10^{22}$ 1/cm$^3$ or $1 \times 10^{21}$ 1/cm$^3$. In particular, the dopant concentration is selected such that a charge carrier concentration reaches the "Mott density", i.e. the semiconductor material has an electrical conduction resistance similar to that of metals.

According to at least one embodiment, the conversion shell is formed of one or more layers of an organic semiconductor material, of one or more layers of a doped transparent conductive oxide and/or of one or more layers of a doped dielectric material or comprises one or more layers of these materials.

For example, metal ions are introduced in an external semiconductor layer of the semiconductor columns, which constitutes the conversion shell. The region of the conversion shell is here preferably not designed for charge carrier transport, in particular electron transport. The semiconductor material, doped with metal ions, of the conversion shell is based for example on the same material system as the semiconductor columns themselves, i.e. for example on GaN. The metal ions for example comprise rare earths or transition metals. The following ions, individually or in combination, may also be used as metal ions in the conversion shell for the purpose of photoluminescence: di- or tripositive lanthanoids and/or actinoids, $Mn^{4+}$, $Mn^{2+}$, $Pb^{2+}$, $Ti^{3+}$, $Cu^+$, $Sb^{3+}$, $Er^{3+}$.

Alternatively or in addition to doping for instance by means of metal ions in the further semiconductor material, which forms the conversion shell, defects may also be present in this further semiconductor material for the purpose of photoluminescence.

Instead of doping a semiconductor material from the same material system with metal ions, for the purpose of photoluminescence another electrically conductive or electrically non-conductive semiconductor material may be grown onto the semiconductor material of the semiconductor columns for the conversion shell.

If a dielectric material is used as the conversion shell, this dielectric material is preferably doped, in particular with metal ions.

It is moreover possible for the conversion shell to comprise a heterostructure, for example similar to a multiple quantum well structure. In this case, the conversion shell is preferably formed from one or more transparent conductive oxides, or TCOs for short. The TCO may be doped. In particular, the TCO is ZnO, which is doped with rare earths and/or with transition metal ions to achieve the desired emission of secondary radiation. Alternatively, the band gap of the TCO, in particular of ZnO, may for instance be reduced by admixing a metal such as cadmium. High doping of the TCO, in particular of ZnO, with a donor such as Ga is also possible, to reduce the effective band gap by "band edge renormalization". As far as concentration of the admixture and/or of the donors is concerned, the same applies as for doping of a semiconductor material with metal ions, as explained above.

The conversion shell is for example grown epitaxially on the semiconductor columns. In particular, the material system (Zn, Mg, Cd, Be)O on (Al, Ga, In, B)N is then used, since these two material systems each have a wurtzite structure in the crystal lattice and also display similar crystal lattice constants, whereby virtually no misalignment occurs in the heterostructure.

Electrically conductive materials which may preferably be used for the conversion shell are one or more materials from the material system (Zn, Mg, Be, Cd) (S, Se, Te). This material group behaves similarly with regard to possible dopants and electrical characteristics to ZnO, see above, but is associated with a smaller band gap, which leads in particular to color mixing with shortwave light, generated for instance by semiconductor columns from the AlInGaN material system, and to advantageous color temperatures and color rendering indices. Materials free of heavy metals for instance from the material system ZnSSeTe may likewise also be used for the conversion shell.

According to at least one embodiment, an interlayer is located between the core shell and the conversion shell. The interlayer preferably directly adjoins the core shell and the conversion shell. The interlayer is preferably wholly located between the core shell and the conversion shell, such that the core shell and the conversion shell are not in direct touching contact.

According to at least one embodiment, the interlayer is electrically conductive and transmissive to the primary radiation. The interlayer is then preferably formed from a transparent conductive oxide such as ZnO or ITO.

According to at least one embodiment, the interlayer is electrically insulating and transmissive to the primary radiation. In particular, the interlayer is then formed of one or more dielectric materials. Such dielectric materials are for example metal oxides such as $Al_2O_3$, $SiO_2$, $TiO_2$, MgO, $ZrO_2$ or ZnO or also metal nitrides such as $Si_3N_4$, AlN or BN.

According to at least one embodiment, the interlayer is applied by CVD, plasma-enhanced CVD, or PECVD for short, by PVD such as sputtering or magnetron sputtering, by laser ablation, by evaporation, by MOVPE, by electron beam epitaxy, by molecular beam epitaxy or by electrolytic or wet chemical application. Corresponding methods may also be used for other interlayers or for the conversion shell overall.

According to at least one embodiment, the dielectric material of the interlayer or the conversion shell, in the case of a dielectric material being used for the conversion shell, is additionally provided with at least one alkali metal or alkaline earth metal, a halogen, Al, Zr, Hf, Ge, Sn, Pb, B, In, Ga, N, C, P, Ti, Sc, Y, As, Sb, S, Se, H or deuterium. These elements preferably have a proportion by mass of at most 5% or particularly preferably of at most 0.1%.

According to at least one embodiment, the thickness of the interlayer is at least 2 nm or 15 nm or 30 nm. Alternatively or in addition, the thickness of the interlayer is at most 500 nm or 150 nm or 50 nm.

According to at least one embodiment, the conversion shell is formed from one or more of the following materials or consists of one or more of these materials, wherein a structure similar to a single quantum well structure or to a multiple quantum well structure may be present: CdS, CdSe, CdTe, ZnS, ZnSe, ZnTe, HgTe, HgSe, GaP, GaAs, GaSb, AlP, AlAs, AlSb, InP, InAs, InSb, SiC or InN. Mixed crystals of ternary or quaternary compounds or combinations of a plurality of different layers of these materials may likewise be used.

According to at least one embodiment, the conversion shell is an organic shell. The conversion shell is then preferably formed for the purpose of photoluminescence from organic luminescent molecules or from at least one organic semiconductor material. Preferably, however, the conversion shell is formed from inorganic and crystalline or polycrystalline materials and is free of organic molecules such as polymers.

According to at least one embodiment, doping of the conversion shell proceeds by means of "diffusion doping". If the conversion shell comprises defects, these may for example be produced by ion irradiation.

According to at least one embodiment, the conversion shell connects together the foot points of adjacent semiconductor columns. In other words, it is possible for the conversion shell to be a continuous layer.

According to at least one embodiment, the semiconductor columns are grown onto a base layer and are connected with the base layer only at the foot points. The foot points are here located in openings in a mask layer on the base layer. The mask layer thus covers all other regions of the base layer, with the exception of the foot points. It is possible that, owing to the mask layer, there is no direct connection between the conversion shell and the base layer. In other words, the conversion shell is then separated from the base layer by the mask layer and by the semiconductor columns.

According to at least one embodiment, all the semiconductor columns or groups each of a plurality of semiconductor columns are connected electrically in parallel. In other words, it is possible for the semiconductor layer sequence not to be pixelated and not to be subdivided into separately drivable regions.

According to at least one embodiment, the primary radiation is blue light. A wavelength of maximum intensity of the primary radiation is preferably at least 420 nm or 435 nm and/or at most 485 nm or 465 nm.

According to at least one embodiment, the interlayer between the conversion shell and the core shell has no wavelength-modifying characteristics with regard to the primary radiation and/or the secondary radiation. In particular, the interlayer then consists of indium-tin oxide, ITO for short, or of zinc oxide.

According to at least one embodiment, the conversion shell on the semiconductor columns is formed in each case of a plurality of three-dimensional structures or comprises such three-dimensional structures. The three-dimensional structures may for example be formed as pyramids, oblique pyramids, prisms or semi-spheres and in particular consist of quantum dot structures, which are based for instance on a III-V semiconductor material or a II-VI semiconductor material. The three-dimensional structures in this case preferably have dimensions of at least 10 nm or 25 nm or 50 nm and preferably of at most 100 nm or 500 nm or 2 µm in their longest direction of extension. The three-dimensional structures are in particular quantum dot structures. The conversion shell does not in this case have to completely surround the semiconductor column, but rather may have gaps which are optionally filled with materials which do not contribute to conversion. The three-dimensional nature of the conversion shell may enhance the outcoupling of light particularly at side faces of the semiconductor columns. In addition, for materials which have a lattice constant different from the semiconductor columns, a strain situation arising on material deposition may advantageously be modified.

According to at least one embodiment, the conversion shell on the semiconductor columns, which in particular consists of or comprises three-dimensional structures, is formed in each case of a plurality of conversion columns or comprises such conversion columns. Main directions of extension of the conversion columns preferably point away from the associated semiconductor column. With regard to the geometric dimensions of the conversion columns, the same preferably applies as for the semiconductor columns, with the provison that the values stated for the semiconductor columns are reduced by a factor of 10. For example, an average diameter of the conversion columns is at most 25% or 15% of the average diameter of the associated semiconductor column.

A light-emitting diode is additionally provided. The light-emitting diode comprises one or more semiconductor layer sequences, as indicated in connection with at least one of the above-stated embodiments. Features of the light-emitting diode are therefore also disclosed for the semiconductor layer sequence and vice versa.

In at least one embodiment, the light-emitting diode comprises one or more semiconductor layer sequences. Furthermore, the light-emitting diode comprises two or more than two electrical terminals, which are designed to feed current to the semiconductor layer sequence. The light-emitting diode can be handled as a self-contained electronic component, for example with tweezers or with a populating machine. The light-emitting diode may optionally also comprise a device for providing protection against damage caused by electrostatic discharges. Furthermore, the light-emitting diode may comprise a package and/or a carrier body, for example of a plastics material, a ceramic or a semiconductor material or with a metallic component such as a leadframe. Likewise, the light-emitting diode may contain optical components such as lenses.

According to at least one embodiment, when the light-emitting diode is in proper use the conversion shell of the semiconductor layer sequence is the only photoluminescent component. In other words, color conversion or significant color conversion of the primary radiation is then achieved solely by way of the conversion shell.

According to at least one embodiment, the light-emitting diode is designed to emit white light when in proper use.

According to at least one embodiment, the light-emitting diode comprises at least one further luminescent material, which is different from the conversion shell. The at least one further luminescent material is designed for at least partial conversion of the primary radiation and/or of the secondary radiation into longer-wavelength tertiary radiation. Conversion into the tertiary radiation proceeds via photoluminescence.

According to at least one embodiment, an average distance between the further luminescent material and the semiconductor columns is at least 1 µm or 5 µm or 10 µm or 20 µm. The average distance to the further luminescent material is for example greater than an average distance between adjacent semiconductor columns and/or than the average height of the semiconductor columns. The further luminescent material is preferably not form-fittingly attached to the semiconductor columns. It is possible for the further luminescent material to be embedded in a matrix material, for instance a polymer such as silicone or a ceramic. In particular, at least one organic bonding agent is located between the further luminescent material and the semiconductor columns and/or the semiconductor layer sequence. In this connection, silicones are also understood as organic.

A semiconductor layer sequence described herein is explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

IN THE FIGURES

Figure 7:
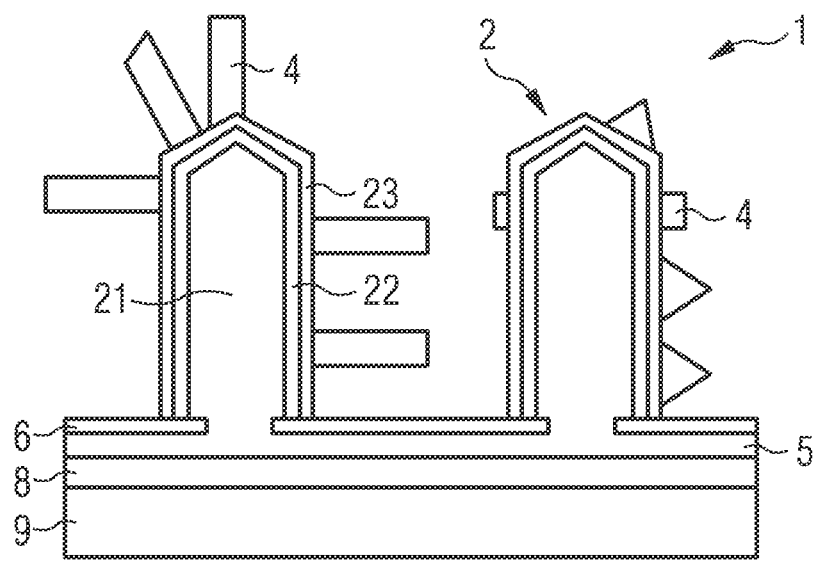
Figure 8:
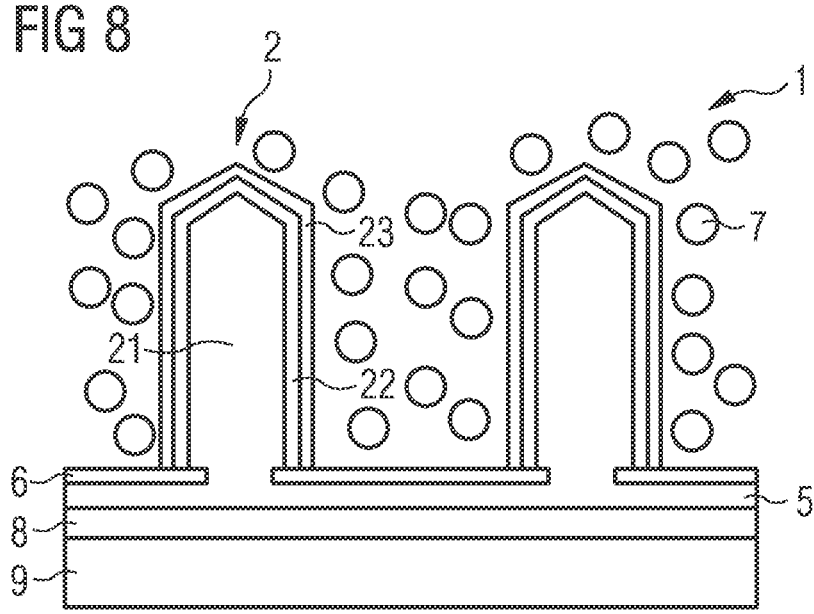

FIGS. 1 to 7 are schematic sectional representations of exemplary embodiments of semiconductor layer sequences described herein, and FIG. 8 is a schematic sectional representation of a modification of a semiconductor layer sequence.

FIG. 1 is a schematic sectional representation of an exemplary embodiment of a semiconductor layer sequence 1. The semiconductor layer sequence 1 is attached to a substrate 9, for instance a growth substrate of sapphire. A buffer layer 8, which may also be composed of a plurality of layers, is located on the substrate 9. The buffer layer 8 is formed of at least one semiconductor material such as undoped GaN.

A base layer 5, preferably formed of a doped semiconductor material such as n-GaN, is applied to the buffer layer 8. A mask layer 6, for instance of silicon dioxide, is in turn applied to the base layer 5. The mask layer 6 comprises a multiplicity of openings, from which foot points 25 of semiconductor columns 2 are grown.

The semiconductor columns 2 comprise a core 21, which is preferably based on the same semiconductor material as the base layer 5, for example on n-GaN. The core 21 grows from the foot points 25, i.e. from the openings in the mask layer 6. Electrical n-contacting of the individual cores 21 proceeds by way of the contiguous base layer 5, which is preferably electrically conductive.

An active zone 22 is grown directly on and round the cores 21 of the semiconductor columns 2. The active zone 22, which may be based on the material system InGaN, preferably comprises a multiple quantum well structure.

A core shell 23 of a semiconductor material of a different conductivity type is grown directly onto and around the active zone 22. The core shell 23 preferably comprises p-GaN. Via the cores 21 and the core shells 23, charge carriers are injected into the active zone 22, such that primary radiation, preferably from the blue region of the spectrum, is generated in the active zone 22 by way of charge carrier recombination.

A conversion shell 4 is grown directly onto the core shell 23, for example epitaxially. The conversion shell 4 is formed for example from one or more layers of a III-V semiconductor material and/or a II-VI semiconductor material. The conversion shell 4 may also be constructed with a multiplicity of layers in a manner similar to a multiple quantum well structure. Alternatively, the conversion shell 4 is formed as a single, homogeneous layer.

The conversion shell 4 is designed to absorb only part of the primary radiation generated in the active zone 22 and to convert it by photoluminescence into longer-wavelength secondary radiation. This makes it possible, without further, additional luminescent materials, to generate polychromatic light, in particular white light, directly from the semiconductor layer sequence 1. It is in this case possible for a plurality of different, secondary radiation-generating conversion shells 4 to be applied, indeed on different semiconductor columns 2.

In a direction perpendicular to the base layer 5, the semiconductor columns 2 have an approximately constant diameter, along entire lateral surfaces 26. The lateral surfaces 26 in this case connect the foot points 25 with tips 27. The tips 27 are pyramidal or conical or alternatively end with a flat plateau. The conversion shell 4 extends over the entire lateral surface 26 and over the entire tips 27. The conversion shell 4 is separated from the base layer 5 by the semiconductor columns 2 and by the mask layer 6. Each of the semiconductor columns 2 is provided with its own conversion shell 4. Adjacent conversion shells 4 are formed in multiple pieces and are not in direct contact with one another.

An average diameter of the semiconductor columns 2 in the region of the lateral surface 26 is preferably at least 0.5 µm and/or at most 3 µm. An average distance between adjacent semiconductor columns is for example at least 2 µm and/or at most 10 µm. A height of the semiconductor columns 2, from the foot points 25 up to the tips 27, is in particular at least 5 µm and/or at most 240 µm. A thickness of the core shell 23 is for example at least 30 nm and/or at most 150 nm or 500 nm. The thickness of the conversion shell 4 preferably amounts to at least 15 nm and/or at most 50 nm.

The semiconductor columns 2 may serve as a waveguide, such that primary radiation exits the active zone 22 mainly at the tips 27 and at the foot points 25. Because the conversion shell 4 lies close to the active zone 22, efficient coupling takes place between radiation guided in the semiconductor columns 2 and the conversion shell 4. For example, a distance between the active zone 22 and the conversion shell 4 is at most 200 nm or 400 nm.

Unlike in the representation in FIG. 1, as also in all the other exemplary embodiments, it is possible for the conversion shell 4 to have a greater thickness at the tips 27 than at the lateral surfaces 26. For example, the thickness of the conversion shell 4 at the tips 27 is increased at least by a factor of 1.5 or 2.5 or 4 and/or at most by a factor 10 or 5 relative to the thickness at the lateral surfaces 26. The conversion shell 4 then preferably has a first constant thickness at the tips 27 and a second, smaller constant thickness at the lateral surfaces 26.

An optical behavior of the semiconductor columns 2 is indicated for example in Kölper et al., Phys. Status Solidi A, 1-9, 2012, DOI:10.1002/PSSA.201228178 or Kölper et al., Proceedings of SPIE, paper no. 793314, 2011. The disclosure content of these documents is hereby included by reference. Possible growth conditions for the production of semiconductor columns as described above are indicated for instance in Mandl et al., Phys. Status Solidi RRL, pages 1 to 15, 2013, DOI 10.1002/pssr.201307250. The disclosure content of this document is included by reference.

The conversion shell 4 is for example a layer of electrically non-conductive GaN, in which for instance metal ions are embedded for the purpose of photoluminescence. Likewise, an electrically conductive or an electrically insulating semiconductor layer of a semiconductor material which is different from a semiconductor material of the semiconductor columns may be used. This semiconductor material may be doped with metal ions or indeed comprise defects for the purpose of photoluminescence.

Figure 2:
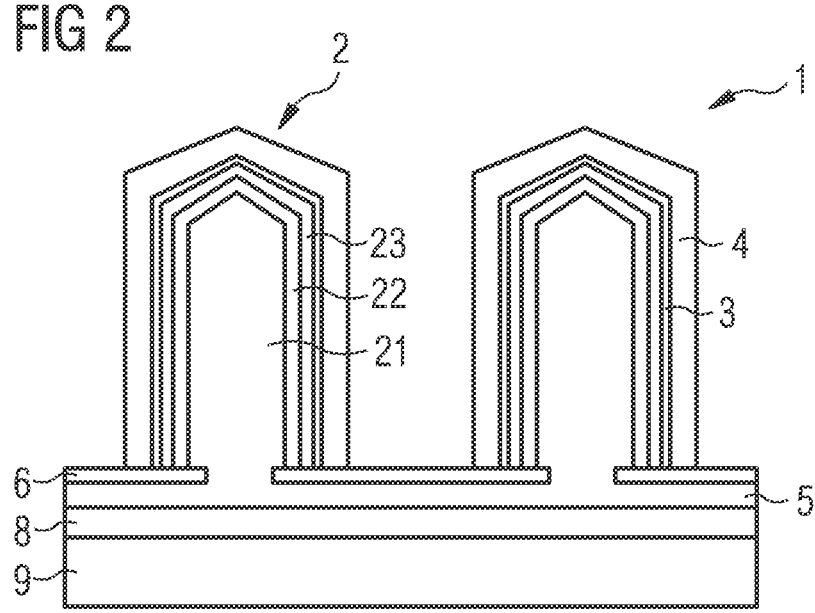

In the exemplary embodiment as shown in FIG. 2, an interlayer 3 is mounted between the core shell 23 and the conversion shell 4. The interlayer 3 is preferably thin, for example with a thickness of between 15 nm and 50 nm. The interlayer 3 may be thinner than the conversion shell 4. The interlayer 3 is a dielectric layer. The conversion shell 4 is for example configured as indicated in connection with FIG. 1.

Figure 3:
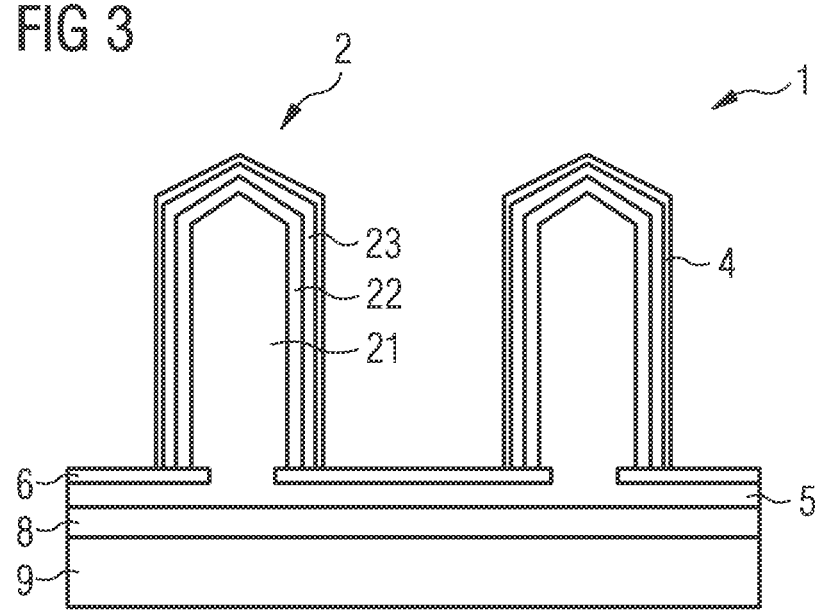

In the exemplary embodiment as shown in FIG. 3, the conversion shell 4 is formed by a dielectric material which comprises metal ions as doping for the purpose of photoluminescence. Instead of a dielectric material, it is also possible to use a transparent, conductive material such as indium-tin oxide or zinc oxide which for example comprises metal ions as doping for the purpose of photoluminescence.

Figure 4:
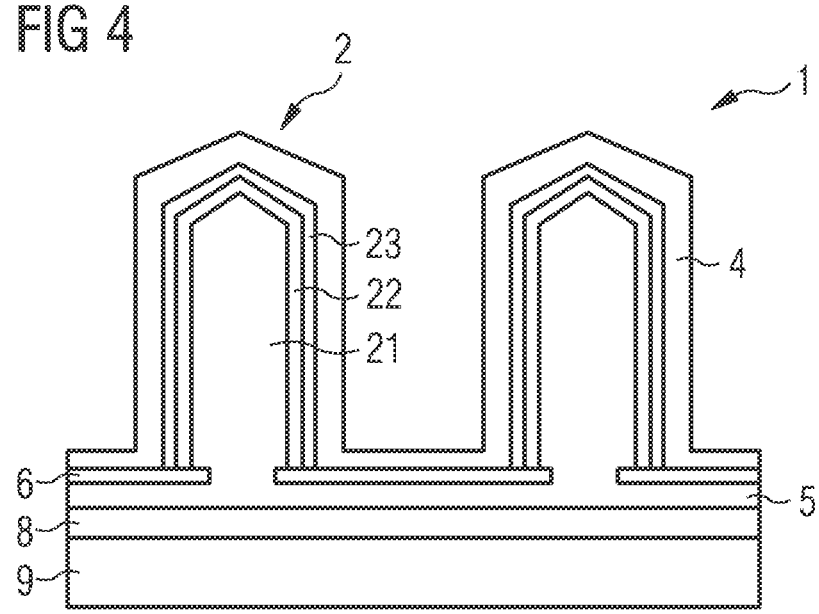

FIG. 4 shows that the conversion shell 4, which is for example formed as shown in connection with FIGS. 1 and 2, is a continuous layer. This means that the conversion shell 4 also completely or substantially completely covers the mask layer 6. The conversion shell 4 is then preferably of electrically conductive construction and is electrically conductively coupled to the core shells 23. The semiconductor columns 2 may consequently have current fed on the p-side.

In the exemplary embodiment as shown in FIG. 5, the conversion shell 4 likewise takes the form of a continuous layer. The conversion shell 4 is here for instance constructed as stated in connection with FIG. 3. Preferably, however, the conversion shell 4 is an electrically conductive layer which is designed to inject current into the core shell 23.

In FIG. 6, the interlayer 3 is located between the conversion shell 4 and the core shell 23. The interlayer 3 is preferably electrically conductive and radiation-transmissive and not designed to convert the primary radiation or the secondary radiation. The interlayer 3 may be a continuous layer which, viewed in plan view, extends between adjacent semiconductor columns 2 and connects them together electrically. The interlayer 3 is then for example formed from zinc oxide or ITO.

According to FIG. 7, the conversion shell 4 covers only part of the core shell 23. The conversion shell 4 is embodied by a multiplicity of three-dimensional conversion structures. In this case, the three-dimensional conversion structures are formed by conversion columns which extend in the direction away from the semiconductor columns 2. The conversion columns 4 may here be comparatively elongate, see the left-hand semiconductor column 2 in FIG. 7. Alternatively, the conversion columns may also be relatively short or also have a pyramidal, conical, prismatic or rounded form, see the semiconductor column 2 located on the right in FIG. 7.

In all the exemplary embodiments of FIGS. 1 to 7, the conversion shell is in each case grown directly on the interlayer or the semiconductor columns 2. The conversion shell 4 therefore follows the shape of the semiconductor columns 2, lying closely against the semiconductor columns 2 and being connected intimately and in form-fittingly therewith. Contiguous growth of the conversion shell 4 on the semiconductor columns 2, optionally via the interlayer 3, may be proven for instance with the assistance of electron microscopy.

In the variant as shown in FIG. 8, no conversion shell is present. Alternatively, a further converter material 7 for wavelength conversion is present, for instance in the form of particles which may be embedded in a matrix material which is not shown. The further converter material 7 substantially fills the entire interspace between adjacent semiconductor columns 2. However, due to the small distance between the semiconductor columns 2 in FIG. 8, this interspace is only comparatively unevenly filled. In such a development, it is only possible to achieve relatively poor optical coupling of the semiconductor columns 2 to the further converter material 7.

Such a further converter material 7 may additionally be present in light-emitting diodes which comprise semiconductor layer sequences 1 described herein.

The further converter material 7 is preferably a luminescent material or a luminescent material mixture comprising at least one of the following luminescent materials: $Eu^{2+}$-doped nitrides such as $(Ca, Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}$:$RE_z$; nitrido-orthosilicates such as $AE_{2-x-a}RE_xEu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM luminescent materials from the $BaO-MgO-Al_2O_3$ system such as $BaMgAl_{10}O_{17}$:$Eu^{2+}$; halophosphates such as $M_5(PO_4)_3(Cl,F):(Eu^{2+},Sb^{3+},Mn^{2+})$; SCAP luminescent materials such as $(Sr,Ba,Ca)_5(PO_4)_3Cl:Eu^{2+}$. The luminescent materials stated in document EP 2 549 330 A1 may also be used as luminescent materials. With regard to the luminescent materials used, the disclosure content of this document is included by reference. "Quantum dots" may moreover also be introduced as converter material. Quantum dots in the form of nanocrystalline materials which contain a group II-VI compound and/or a group III-V compound and/or a group IV-VI compound and/or metal nanocrystals, are preferred in this case.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The work on which this application is based was funded by the European Union under funding code NMP3-SL-2012-280694.

This patent application claims priority from German patent application 10 2014 117 995.1, the disclosure content of which is hereby included by reference.

The invention claimed is:

1. A semiconductor layer sequence for generating visible light with a multiplicity of semiconductor columns, wherein
   the semiconductor columns each comprise a core of a semiconductor material of a first conductivity type and a core shell around the core of a semiconductor material of second conductivity type,
   an active zone of the semiconductor columns is located between the core and the core shell for generating primary radiation by means of electroluminescence,
   the semiconductor material of the first conductivity type is n-doped and the semiconductor material of the second conductivity type is p-doped and the core, the active zone and the core shell are based on the same semiconductor material,
   a conversion shell is applied onto each of the semiconductor columns, the conversion shell surrounding the associated core shell at least partially form-fittingly and at least partially absorbing the primary radiation and converting it into secondary radiation of a longer wavelength by way of photoluminescence,
   the conversion shell is applied directly onto the core shell and the core shell has a constant layer thickness,
   the conversion shells, which are applied to adjacent semiconductor columns, only incompletely fill an interspace between these semiconductor columns, such that no continuous, rectilinear connection is produced between adjacent semiconductor columns solely by way of the conversion shells,
   the conversion shells each have a constant thickness, with a tolerance of at most 20% of an average thickness of the conversion shells, and
   when in proper use, the conversion shell is the only photoluminescent component and a light-emitting diode associated with the semiconductor layer sequence emits white light when in proper use.

2. The semiconductor layer sequence according to claim 1, wherein
   the semiconductor material of the first conductivity type and the semiconductor material of the second conductivity type as well as the active zone are based on AlInGaN,
   the semiconductor columns are grown on a contiguous base layer, which is based on AlInGaN, such that foot points of the semiconductor columns each emerge from the base layer, and
   the conversion shell is free of organic materials and is applied to the semiconductor columns form-fittingly at least on each of tips, opposite the foot points, and on lateral surfaces which connect the tips to the foot points.

3. The semiconductor layer sequence according to claim 2, wherein the conversion shell connects together the foot points of adjacent semiconductor columns and is formed as a continuous layer, wherein the conversion shell is U-shaped when viewed in cross-section, wherein the semiconductor columns are of rectangular shape, wherein the foot points are in direct contact with the base layer only at openings in a mask layer and, between the semiconductor columns, the conversion shell is separated from the base layer by the mask layer.

4. The semiconductor layer sequence according to claim 1, wherein
the average thickness of the conversion shell is between 2 nm and 500 nm inclusive,
an average column diameter of the semiconductor columns is between 0.1 µm and 5 µm inclusive,
an average column height of the semiconductor columns amounts to between 0.5 µm and 50 µm inclusive,
a quotient of the column height and the column diameter is at least 2.5 and at most 100, and
an average distance between adjacent semiconductor columns amounts to between 0.5 µm and 10 µm inclusive.

5. The semiconductor layer sequence according to claim 1, wherein the conversion shell for converting the primary radiation consists of a layer of a III-V semiconductor material or of a II-VI semiconductor material, and wherein this semiconductor material is doped or is provided with defects with a dopant concentration of between $1\times10^{18}$ l/cm$^3$ and $1\times10^{22}$ l/cm$^3$ inclusive.

6. The semiconductor layer sequence according to claim 1, wherein the conversion shell for converting the primary radiation comprises at least one of a layer of an organic semiconductor material, of a doped transparent conductive oxide, and of a doped dielectric material.

7. The semiconductor layer sequence according to claim 1, wherein an interlayer is located between the core shell and the conversion shell, wherein the interlayer directly adjoins the core shell and the conversion shell, and wherein the interlayer is electrically conductive and transmissive to the primary radiation and is formed from a transparent conductive oxide.

8. The semiconductor layer sequence according to claim 1, wherein an interlayer is located between the core shell and the conversion shell, and wherein the interlayer is electrically insulating and transmissive to the primary radiation and is formed from a dielectric material.

9. The semiconductor layer sequence according to claim 1, wherein all the semiconductor columns or groups of a plurality of semiconductor columns are electrically connected in parallel.

10. The semiconductor layer sequence according to claim 1, wherein the conversion shell comprises on each of the semiconductor columns a plurality of three-dimensional conversion structures or consists of such three-dimensional conversion structures.

11. A light-emitting diode with
at least one semiconductor layer sequence for generating visible light with a multiplicity of semiconductor columns, wherein
the semiconductor columns each comprise a core of a semiconductor material of a first conductivity type and a core shell around the core of a semiconductor material of second conductivity type,
an active zone of the semiconductor columns is located between the core and the core shell for generating primary radiation by means of electroluminescence,
a conversion shell is applied onto each of the semiconductor columns, the conversion shell surrounding the associated core shell at least partially form-fittingly and at least partially absorbing the primary radiation and converting it into secondary radiation of a longer wavelength by way of photoluminescence,
the conversion shells, which are applied to adjacent semiconductor columns, only incompletely fill an interspace between these semiconductor columns, such that no continuous, rectilinear connection is produced between adjacent semiconductor columns solely by way of the conversion shells,
the conversion shells each have a constant thickness, with a tolerance of at most 20% of an average thickness of the conversion shells; and
at least two electrical terminals to feed current to the semiconductor layer sequence, wherein
the light-emitting diode can be handled as a self-contained electronic component,
at least one further luminescent material for at least partial conversion of the primary radiation and the secondary radiation into longer-wavelength tertiary radiation by means of photoluminescence is arranged downstream of the semiconductor layer sequence,
an average distance between the further luminescent material and the semiconductor columns amounts to at least 1 µm and at least one organic bonding agent is located between the luminescent material and the semiconductor columns.

12. The light-emitting diode according to claim 11, wherein, when in proper use, the conversion shell is the only photoluminescent component, and wherein the light-emitting diode emits white light when in proper use.

13. A semiconductor layer sequence for generating visible light with a multiplicity of semiconductor columns, wherein
the semiconductor columns each comprise a core of a semiconductor material of a first conductivity type and a core shell around the core of a semiconductor material of second conductivity type,
an active zone of the semiconductor columns is located between the core and the core shell for generating primary radiation by means of electroluminescence,
a conversion shell is applied onto each of the semiconductor columns, the conversion shell surrounding the associated core shell at least partially form-fittingly and at least partially absorbing the primary radiation and converting it into secondary radiation of a longer wavelength by way of photoluminescence,
the conversion shells, which are applied to adjacent semiconductor columns, only incompletely fill an interspace between these semiconductor columns, such that no continuous, rectilinear connection is produced between adjacent semiconductor columns solely by way of the conversion shells,
the conversion shells each have a constant thickness, with a tolerance of at most 20% of an average thickness of the conversion shells, and
an interlayer is located between the core shell and the conversion shell,
the interlayer directly adjoins the core shell and the conversion shell, and
the interlayer is electrically conductive and transmissive to the primary radiation and is formed from a transparent conductive oxide.

14. The semiconductor layer sequence according to claim 13, wherein the primary radiation is blue light and exhibits a wavelength of maximum intensity of between 420 nm and 485 nm inclusive, and wherein the interlayer has no wavelength-modifying characteristics with regard to the primary radiation or the secondary radiation and is formed from indium-tin oxide or from ZnO.

15. A semiconductor layer sequence for generating visible light with a multiplicity of semiconductor columns, wherein
the semiconductor columns each comprise a core of a semiconductor material of a first conductivity type and a core shell around the core of a semiconductor material of second conductivity type,
an active zone of the semiconductor columns is located between the core and the core shell for generating primary radiation by means of electroluminescence,
a conversion shell is applied onto each of the semiconductor columns, the conversion shell surrounding the associated core shell at least partially form-fittingly and at least partially absorbing the primary radiation and converting it into secondary radiation of a longer wavelength by way of photoluminescence,
the conversion shells, which are applied to adjacent semiconductor columns, only incompletely fill an interspace between these semiconductor columns, such that no continuous, rectilinear connection is produced between adjacent semiconductor columns solely by way of the conversion shells,
the conversion shells each have a constant thickness, with a tolerance of at most 20 percent of an average thickness of the conversion shells,
an interlayer is located between the core shell and the conversion shell, and
the interlayer is electrically insulating and transmissive to the primary radiation and is formed from dielectric material.

* * * * *